(12) United States Patent
Matsuo

(10) Patent No.: US 6,737,309 B2
(45) Date of Patent: May 18, 2004

(54) COMPLEMENTARY MISFET

(75) Inventor: Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/962,883

(22) Filed: Sep. 25, 2001

(65) Prior Publication Data

US 2002/0037615 A1 Mar. 28, 2002

(30) Foreign Application Priority Data

Sep. 27, 2000 (JP) ........................................ 2000-293929

(51) Int. Cl.[7] ......................................... H01L 21/8238
(52) U.S. Cl. ........................ 438/199; 438/197; 438/299
(58) Field of Search ................. 438/197, 199, 438/2, 99

(56) References Cited

U.S. PATENT DOCUMENTS

| | | | | |
|---|---|---|---|---|
| 5,189,504 A | * | 2/1993 | Nakayama et al. | 257/422 |
| 5,965,911 A | * | 10/1999 | Joo et al. | 257/288 |
| 6,140,688 A | * | 10/2000 | Gardner et al. | 257/412 |
| 6,184,083 B1 | * | 2/2001 | Tsunashima et al. | 438/257 |
| 6,270,944 B1 | * | 8/2001 | Wolk et al. | 430/273.1 |
| 6,271,573 B1 | * | 8/2001 | Suguro | 257/407 |
| 6,376,888 B1 | * | 4/2002 | Tsunashima et al. | 257/407 |
| 6,482,660 B2 | * | 11/2002 | Conchieri et al. | 438/7 |

OTHER PUBLICATIONS

U.S. patent application Ser. No. 09/559,356, Tsunashima et al., filed Apr. 27, 2000.

* cited by examiner

*Primary Examiner*—Long Pham
(74) *Attorney, Agent, or Firm*—Frommer Lawrence & Haug LLP

(57) ABSTRACT

A gate electrode of an n-type MIS transistor includes a first metal-containing film, which is formed in contact with a gate insulation film and has a Fermi level on a conductive band side from a substantial center of a band gap of a semiconductor substrate, and a second metal-containing film formed on the first metal-containing film and having a lower resistance than the first metal-containing film. A gate electrode of a p-type MIS transistor includes a conductive coating film, which is formed in contact with the gate insulation film and has a Fermi level on a valence band side from a substantial center of the band gap of the semiconductor substrate, and the second metal-containing film formed on the conductive coating film and having a lower resistance than the conductive coating film.

5 Claims, 9 Drawing Sheets

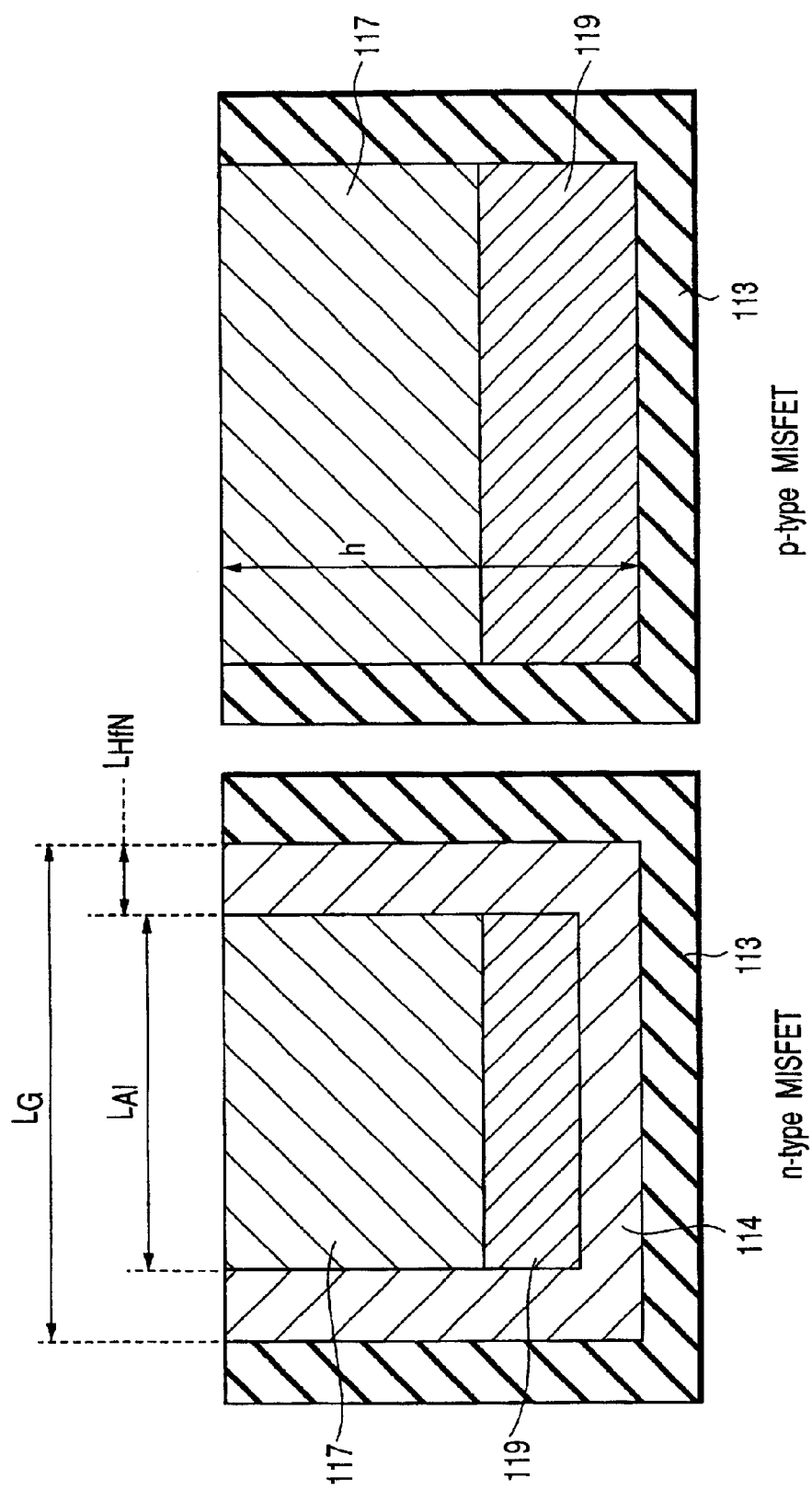

COMPLEMENTARY MISFET

CROSS-REFERECCE TO RELATED APPLICATIONS

This application is based upon and claims the benefit of priority from the prior Japanese Patent Application No. 2000-293929, filed Sep. 27, 2000, the entire contents of which are incorporated herein by reference.

BACKGROUND OF THE INVENTION

1. Field of the Invention

The present invention relates to a semiconductor device and a method of fabricating the same, and more particularly to an improvement of gate electrodes of an n-type MIS transistor and a p-type MIS transistor.

2. Description of the Related Art

Miniaturization of devices is indispensable in enhancing the performance of MIS transistors. However, a silicon oxide film, which is currently used as a gate insulation film, has a low dielectric constant, and thus the capacitance of the gate insulation film cannot be increased. In addition, since a polysilicon used as a gate electrode has a high resistivity, it is difficult to decrease the resistance of the gate electrode. To solve these problems, there is an idea that a high dielectric constant material is used for the gate insulation film and a metallic material is used for the gate electrode.

However, these materials have drawbacks in that the heat resistance thereof is lower than that of currently used materials. A damascene gate technique has been proposed as a technique wherein a gate insulation film and a gate electrode can be formed after a high-temperature process is carried out.

In a case where a metal is buried as gate electrodes by the damascene gate technique, the gate electrodes of an n-type MISFET and a p-type MISFET are formed of a single metal and the work function of the gate electrodes is fixed. Thus, unlike the case of polysilicon gates, it is not possible to optimize threshold values by forming different gate electrodes in n-type and p-type devices. A dual metal gate process is thus required in order to form gate electrodes of different materials in n-type and p-type devices.

The inventors previously filed a patent application (application Ser. No. 09/559,356) for a technique for forming different metal gate electrodes in n-type and p-type devices. The steps of a process of fabricating a semiconductor device according to the method of this application will now be described with reference to FIGS. 3A to 3J.

To start with, a device isolation region 101 is formed on a silicon substrate 100 by means of an STI (shallow trench isolation) technique, etc. An p-well 102 is formed in a formation region of an n-type MISFET and a n-well 103 is formed in a formation region of a n-type MISFET. A dummy gate lamination structure is then formed as a dummy gate that is to be removed later, by means of techniques of oxidation, CVD, lithography, RIE, etc. The dummy gate lamination structure comprises a gate oxide film 104, which is, e.g. about 6 nm thick, a polysilicon 105, which is about 150 nm thick, and a silicon nitride film 106, which is about 50 nm thick. An extension diffusion layer region 107 is formed using an ion implantation technique. A gate side wall 108 with a thickness of about 40 nm, which is formed of a silicon nitride film, is formed by CVD and RIE techniques.

In FIG. 3B, a source/drain diffusion layer 109 is formed by an ion implantation technique. Then, using the dummy gate as a mask, a silicide 110 of cobalt, titanium, etc. with a thickness of about 40 nm is formed only in the source/drain region by means of a salicide process technique.

In FIG. 3C, a silicon oxide film, for example, is deposited by CVD as an interlayer film 111. The silicon oxide film is then flattened by CMP to expose surfaces of the silicon nitride film 106 and gate side wall 108 at an upper part of the dummy gate.

In FIG. 3D, the silicon nitride film 106 at the upper part of the dummy gate is selectively removed relative to the interlayer film 111 by using a phosphoric acid, for instance. At this time, the gate side wall 108 at the side wall of the gate is also etched away to a level equal to the level of the polysilicon 105. Subsequently, the polysilicon of the dummy gate is selectively removed relative to the interlayer film 111 and the gate side wall 108 of the silicon nitride film by means of, e.g. a radial atom etching technique. Thus, a gate trench 112 is created. The dummy gate oxide film 104 is provided at the bottom of the gate trench 112.

In FIG. 3E, the dummy gate oxide film 104 is removed by a wet process using hydrofluoric acid, etc., thereby exposing the p-well 102 or n-well 103 at the bottom of the gate trench 112.

A gate insulation film 113 of, e.g. a hafnium oxide film is formed as a high dielectric constant insulator over the entire surface of the resultant structure.

In FIG. 3F, a hafnium nitride film 114, as an example of metal having a work function of 4.6 eV or less, is formed by CVD or sputtering with a thickness of about 10 nm, or preferably less than 10 nm, on the entire surface of the resultant.

The steps of FIGS. 3A to 3F are carried out for both the n-type MIS transistor formation region and p-type MIS transistor formation region, but these Figures show only one of these regions. As regards the subsequent steps, FIGS. 3G to 3J show both of the n-type MIS transistor (n-type MISFET) and p-type MIS transistor (p-type MISFET).

In FIG. 3G, that portion of a resist 115, which lies in the p-type MISFET region, is removed by lithography.

In FIG. 3H, wet etching is performed using hydrogen peroxide solution, thereby removing the hafnium nitride film 114 from the p-type region alone. At this time, the gate insulation film 113, which is the hafnium oxide film, is not etched since it is insoluble in the hydrogen peroxide solution.

In FIG. 3I, the resist 115 is removed, and tantalum nitride 116, as an example of a material having a work function of 4.6 eV or more, is deposited with a thickness of at least about 10 nm.

In FIG. 3J, aluminum 117 is deposited as a low-resistance gate electrode material on the entire surface of the resultant by means of sputtering or CVD. Then, the aluminum is subjected to CMP, thus burying the aluminum 117 in the gate trenches.

A CMISFET is fabricated through the above-described steps, which has gate electrode structures comprising, respectively, an n-type lamination structure of the hafnium nitride film 114, tantalum nitride 116 and aluminum 117, and a p-type lamination structure of the tantalum nitride film 116 and aluminum 117. Accordingly, the threshold values can be optimized since the work function of the gate electrode of the n-type device is 4.6 eV or less and the work function of the gate electrode of the p-type device is 4.6 eV or more.

This structure has a problem, however. FIGS. 4A and 4B are enlarged views of the gate electrode portions of the n-type MISFET and p-type MISFET. In the n-type MISFET, a width $L_{A1}$ of the aluminum of the gate electrode is expressed by $$L_{A1}=L_G-2\times L_{TaN}-2\times L_{HfN}$$

where $L_{A1}$ is a width of the aluminum 117, $L_G$ is a gate length, $L_{TaN}$ is a width of the tantalum nitride film 116, and $L_{HfN}$ is a width of the hafnium nitride film 114.

The tantalum nitride film 116 functions to control the work function of the gate electrode, and also serves as a barrier metal for preventing the upper electrode, i.e. the aluminum 117, from diffusing in the gate insulation film. Accordingly, in view of the gate breakdown voltage and reliability, it is necessary that the thickness of the tantalum nitride film 116 be at least about 10 nm or more.

However, in the case where the gate length ($L_G$) is 40 nm or less, if the film thickness ($L_{TaN}$) of the tantalum nitride film 116 is 10 nm and the thickness ($L_{HfN}$) of the hafnium nitride film 114 is 10 nm, the width ($L_{A1}$) of the aluminum 117 would be 0 nm. Thus, if the gate length ($L_G$) is 40 nm or less, it is impossible to bury the aluminum 117. As a result, the gate resistance greatly increases and a high-performance CMISFET cannot be fabricated. The thickness of the hafnium nitride can be reduced to about 1 nm since the work function alone needs to be controlled. However, in this case, too, the width ($L_{A1}$) of the aluminum 117 would become 0 nm, when the gate length is 20 nm.

As has been described above, in the semiconductor device with the damascene gate structure, if materials having different work functions are used in the n-type MISFET and p-type MISFET, it is not possible to bury an electrode material with low resistance, and a high-performance CMISFET cannot be fabricated.

BRIEF SUMMARY OF THE INVENTION (1) The present invention provides a semiconductor device comprising: a semiconductor substrate having a p-well and an n-well at a surface portion thereof; an insulation film formed on the semiconductor substrate and having an opening, at a bottom of which the p-well or n-well is exposed; a gate insulation film formed on the n-well or p-well exposed at the bottom of the opening; a first gate electrode including a first metal-containing film, which is formed in contact with the gate insulation film on the p-well and has a Fermi level on a conductive band side from a substantial center of a band gap of the semiconductor substrate, and a second metal-containing film formed on the first metal-containing film and having a lower resistance than the first metal-containing film; a n-type source and a n-type drain formed on the semiconductor substrate and configured to sandwich the first gate electrode; a second gate electrode including a conductive coating film, which is formed in contact with the gate insulation film on the n-well and has a Fermi level on a valence band side from a substantial center of the band gap of the semiconductor substrate, the conductive coating film being formed only at a bottom of the opening, and the second metal-containing film formed on the conductive coating film and having a lower resistance than the conductive coating film; and an p-type source and an p-type drain formed on the semiconductor substrate and configured to sandwich the second gate electrode.

(2) The invention provides a method of fabricating a semiconductor device comprising: forming a structure comprising a p-well and an n-well formed on a surface of a semiconductor substrate, an n-type source and an n-type drain formed on the surface of the semiconductor substrate and configured to sandwich a channel region of a n-type MIS transistor formed at the p-well, an insulation film having openings, at bottom of which the p-well and the n-well are exposed, the n-type source and n-type drain formed on the p-well and configured to sandwich the associated opening, and a p-type source and a p-type drain formed on the n-well and configured to sandwich the associated opening; forming a gate insulation film on the p-well and the n-well exposed at the bottoms of the openings; forming a first metal-containing film on the p-well and the n-well exposed at the bottoms of the openings, the first metal-containing film having a Fermi level on a conductive band side from a substantial center of a band gap of the semiconductor substrate; removing the first metal-containing film on the n-well; forming a conductive coating film on the first metal-containing film and on the gate insulation film formed on the n-well, the conductive coating film having a Fermi level on a valence band side from a substantial center of the band gap of the semiconductor substrate; and forming a second metal-containing film on the conductive coating film, the second metal-containing film having a lower resistance than the first metal-containing film and the conductive coating film, thus filling the openings.

BRIEF DESCRIPTION OF THE SEVERAL VIEWS OF THE DRAWING

FIGS. 2A and 2B are cross-sectional views showing gate electrode portions of the n-type and p-type MISFETs fabricated by the steps shown in FIGS. 1A to 1H;

DETAILED DESCRIPTION OF THE INVENTION

FIGS. 1A to 1I are cross-sectional views showing the steps of fabricating a semiconductor device according to an embodiment of the present invention.

Figure 1A:
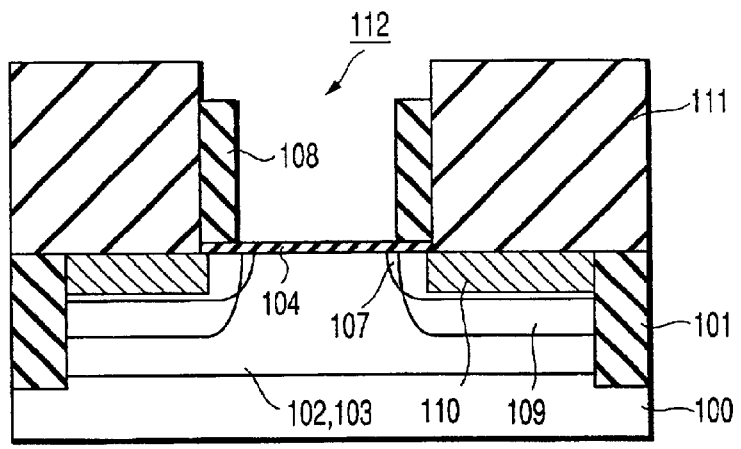
FIGS. 1A to 1I are cross-sectional views illustrating steps of fabricating n-type and p-type MISFETs with damascene gate structures according to an embodiment of the present invention.

A structure as shown in FIG. 1A is prepared through the prior-art fabrication steps shown in FIGS. 3A to 3D. A gate trench 112 is formed in a gate formation region by the interlayer film 111 and the gate side wall 18 formed of a second silicon nitride film with a width of about 40 nm on the silicon substrate 100, on which the silicide 110 of cobalt, titanium, etc. with a thickness of about 40 nm is formed on only the device isolation region 101, extension diffusion layer region 107, source/drain diffusion layer 109 and source/drain region. The dummy gate oxide film 104 is provided at the bottom of the gate trench 112.

Figure 1B:
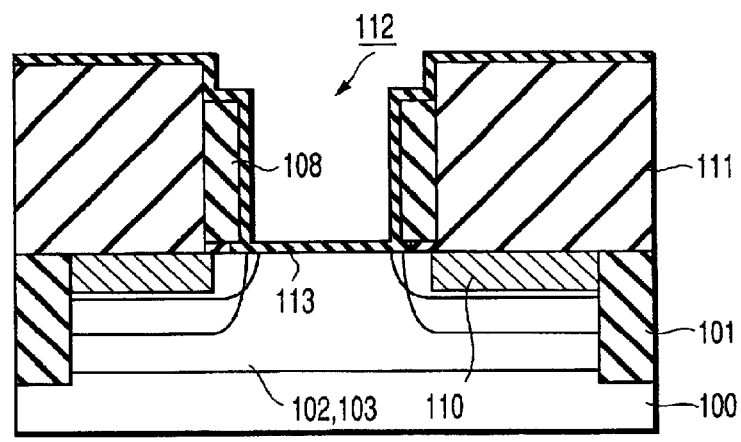

In FIG. 1B, the dummy gate oxide film 104 at the bottom of the gate trench 112 is removed by a wet process using hydrofluoric acid, etc., thereby exposing the whole gate formation portion. A gate insulation film 113 of, e.g. a hafnium oxide film is formed as a high dielectric constant insulator over the entire surface of the resultant structure. In an example of the method of forming the hafnium oxide film, a hafnium nitride film is first formed by means of, e.g.

CVD using HfCl$_4$ and NH$_3$, CVD using organic Hf gas, etc., or sputtering using a target of hafnium oxide or a target of hafnium. The hafnium nitride film is then oxidized to form the hafnium oxide film. Preferably, the thickness of the hafnium nitride film at this time should be very small, e.g. about several nm. As the thickness of the hafnium nitride film increases, nitrogen tends to remain in the film after oxidation of the hafnium nitride. This tendency has to be prevented.

Figure 1C:
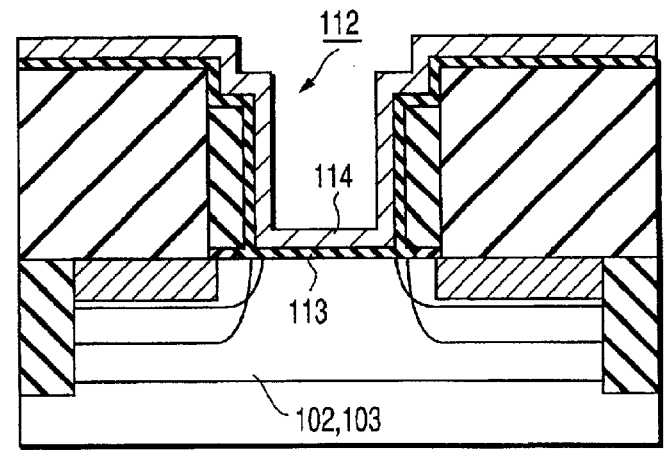

In FIG. 1C, a hafnium nitride film (first metal-containing film) 114, as an example of electrode material having a Fermi level on a conductive band side from a center of a band gap of the silicon substrate, i.e. having a work function of 4.6 eV or less, is formed with a thickness of about 10 nm, or preferably less than 10 nm, on the entire surface of the resultant.

The steps of FIGS. 1A to 1C are carried out for both the n-type MIS transistor formation region and p-type MIS transistor formation region, but these Figures show only one of these regions. As regards the subsequent steps, FIGS. 1D to 1I show both of the n-type MIS transistor (n-type MISFET) and p-type MIS transistor (p-type MISFET).

Figure 1D:
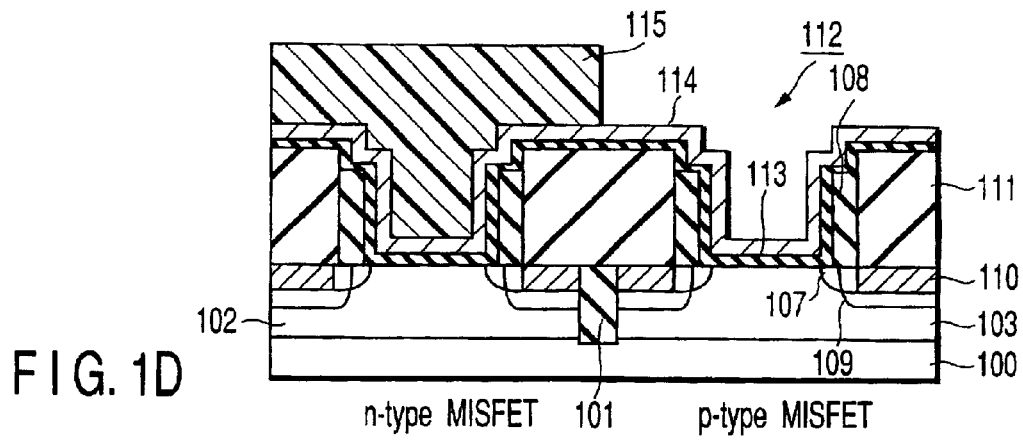

In FIG. 1D, that portion of a resist 115, which lies in the p-type MOSFET region, is removed by lithography.

Figure 1E:
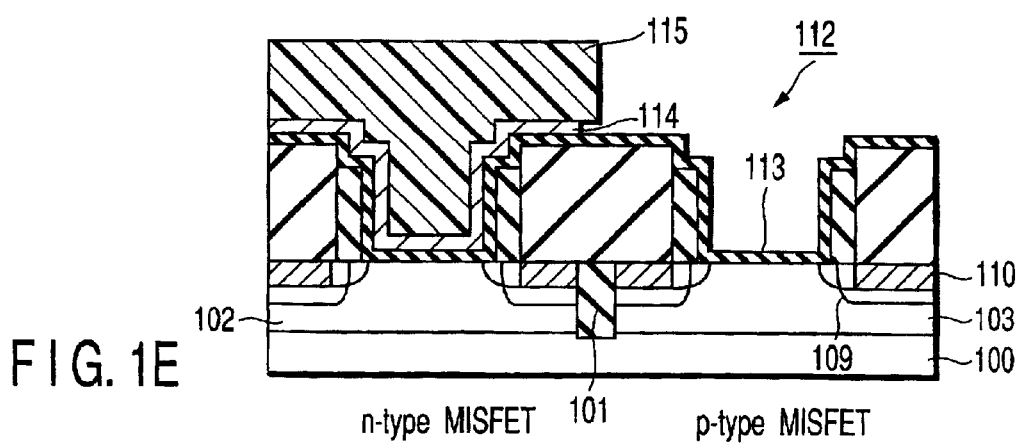

In FIG. 1E, wet etching is performed using hydrogen peroxide solution, thereby removing the hafnium nitride film 114 from the p-type region alone. At this time, the gate insulation film 113, which is the hafnium oxide film, is not etched since it is insoluble in the hydrogen peroxide solution.

Figure 1F:
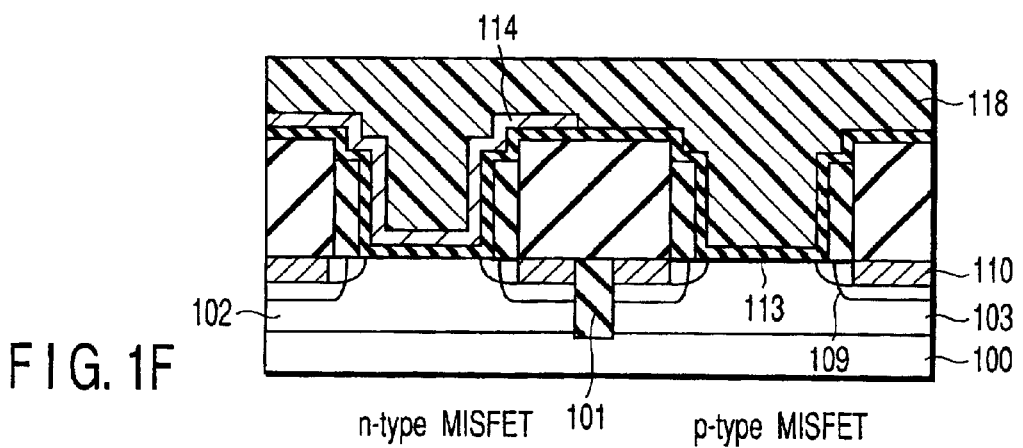

In FIG. 1F, the resist 115 is removed, and an organic coating film 118 containing carbon is coated on the entire surface of the resultant. The use of the coating film provides adequate flatness, even if a CMP process or the like is not carried out. Of course, the organic coating film 118 may be flattened by a CMP process.

Figure 1G:
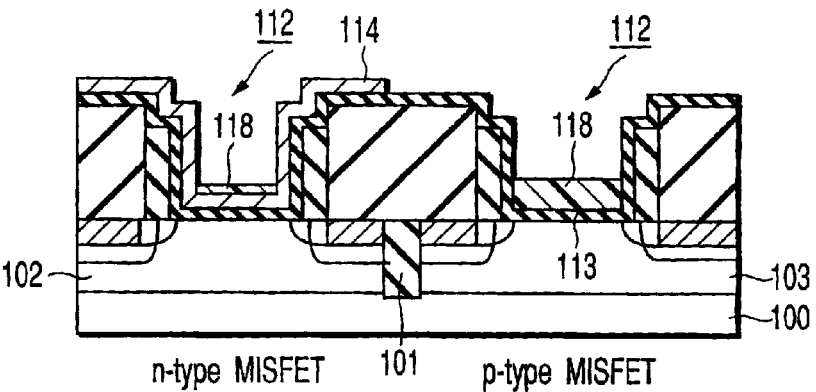
Figure 1H:
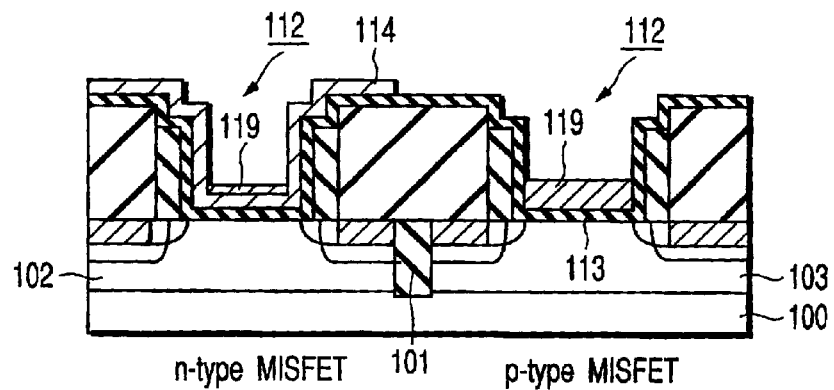

In FIG. 1G, the entire surface of the organic coating film 118 is etched so that the organic coating film 118 remains only in the gate trenches 112. The thickness of the organic coating film 118 should preferably be 10 nm or more. An example of the method of etching the entire surface is ashing by means of an oxygen plasma, as in the case of a resist. Then, as shown in FIG. 1H, the organic coating film 118 is decomposed by heat treatment, optical energy of a laser, etc., or electron energy by electron radiation. Thus, the organic coating film 118 is graphitized to form an electrically conductive graphite organic coating film (conductive coating film) 119. If heat treatment is used, graphitization can easily be performed at 600 to 700° C. or more.

In the case where the coating film is composed of serially connected benzene rings, e.g. an organic molecule such as pentacene comprising five benzene rings connected, electrical conductivity may be provided by addition of iodine, etc. Alternatively, a molecule comprising more than five benzene rings connected may be used to provide an organic film that is a conductor even if no process is performed. Even if any method is used, the work function of carbon is 4.6 ev or more. Thus, an electrode with a work function of 4.6 eV or more can be formed.

Figure 1I:
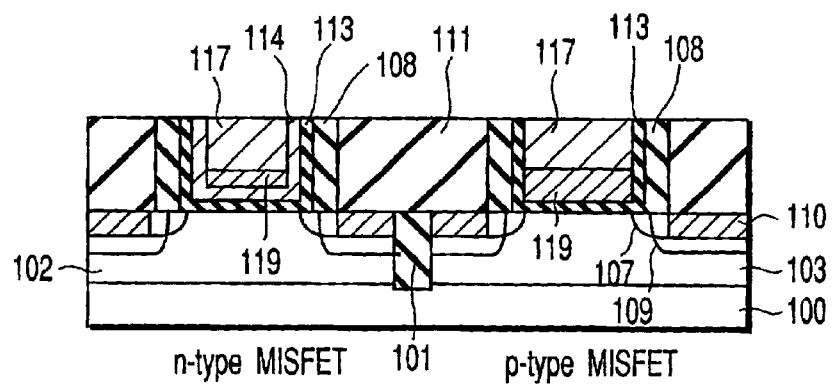
Figure 3A:
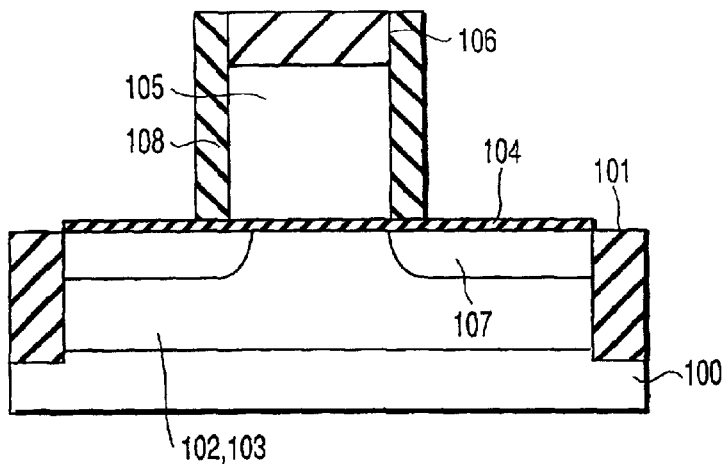
FIGS. 3A to 3J are cross-sectional views illustrating steps of fabricating n-type and p-type MISFETs with prior-art damascene gate structures.
Figure 3B:
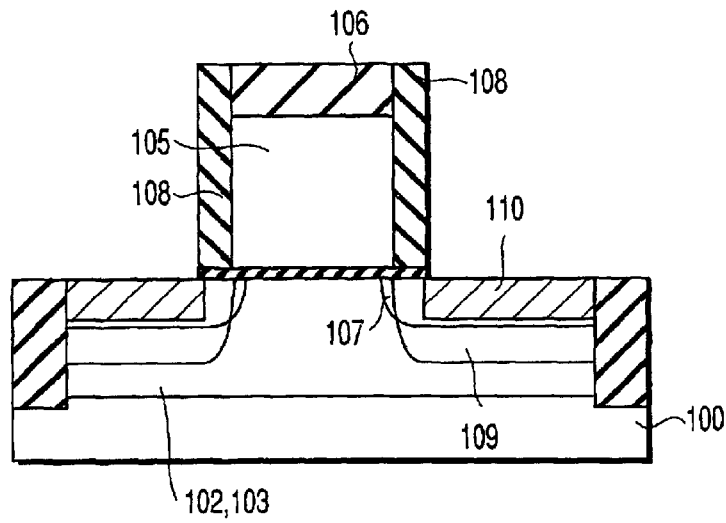
Figure 3C:
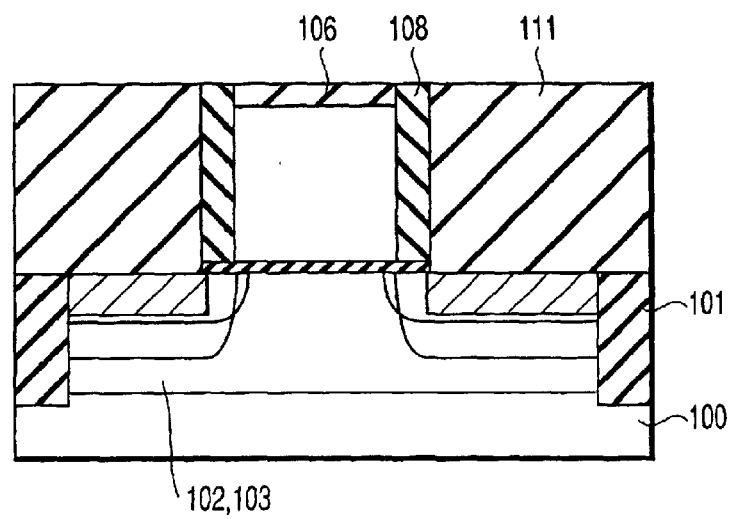
Figure 3D:
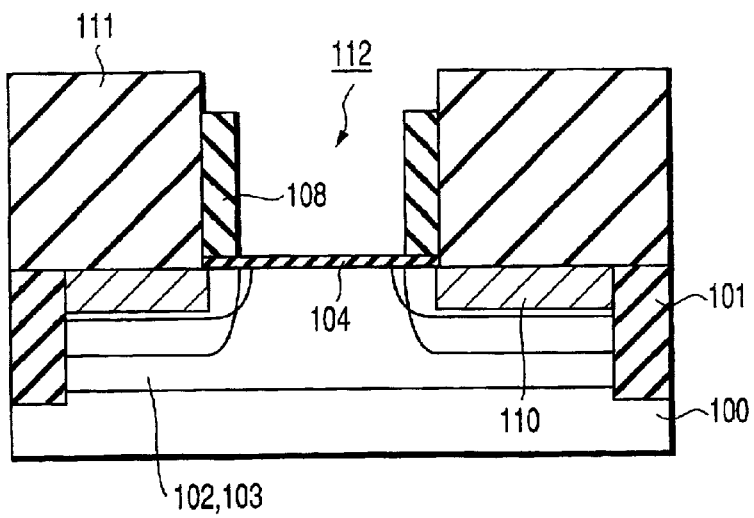
Figure 3E:
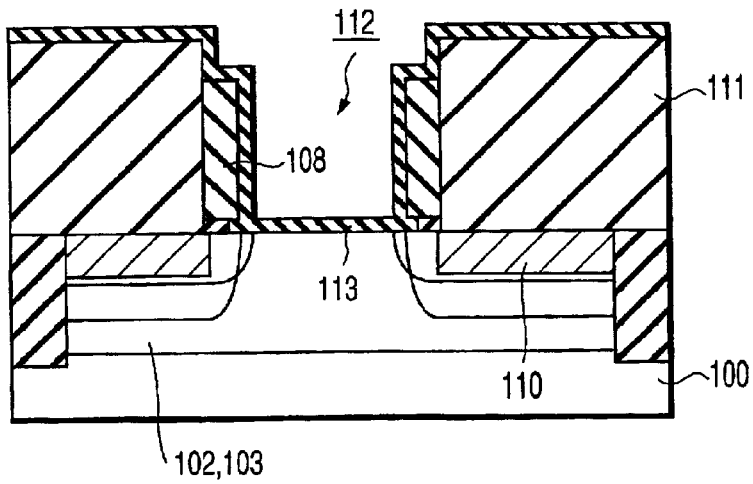
Figure 3F:
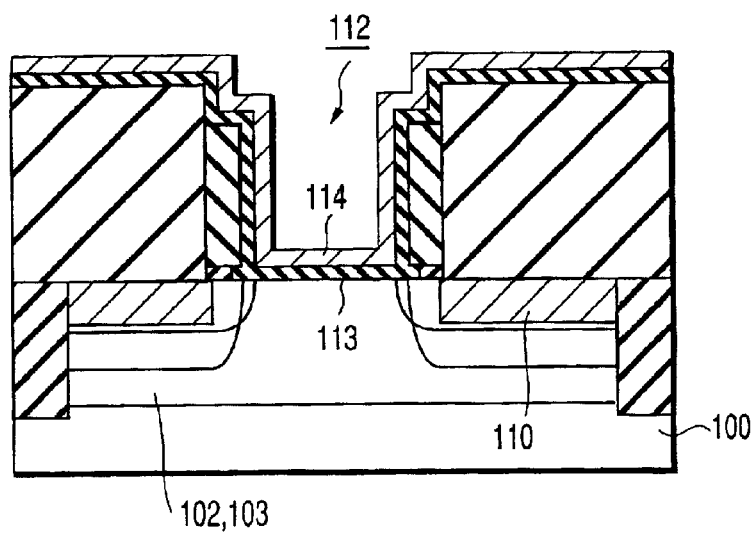
Figure 3G:
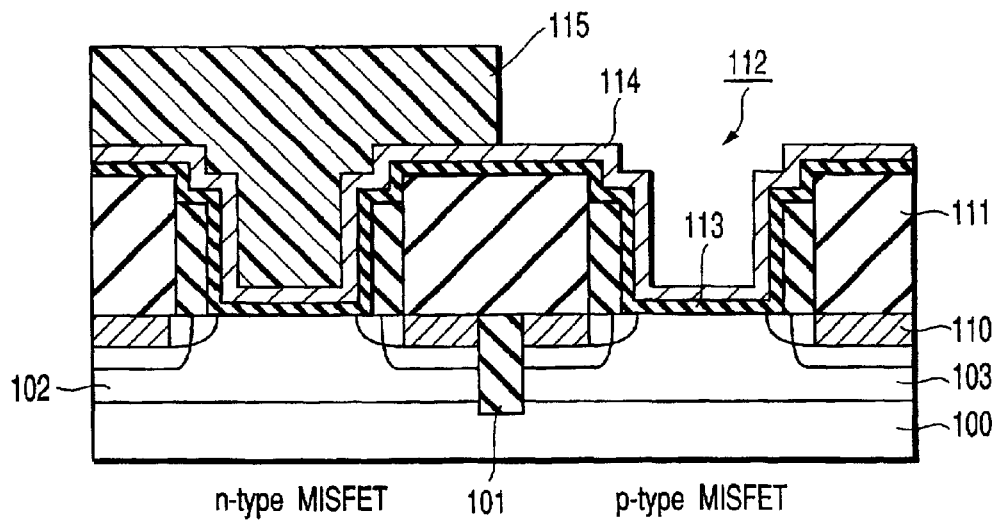
Figure 3H:
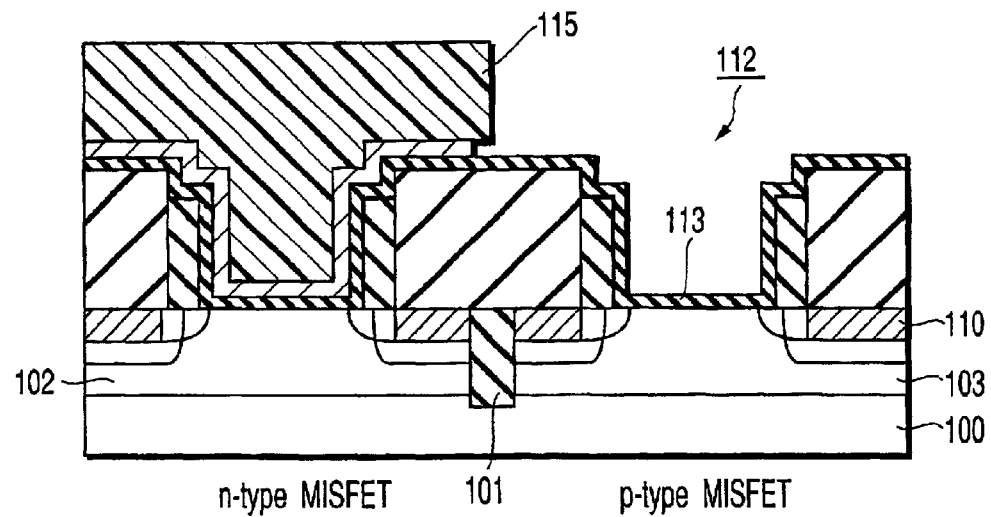
Figure 3I:
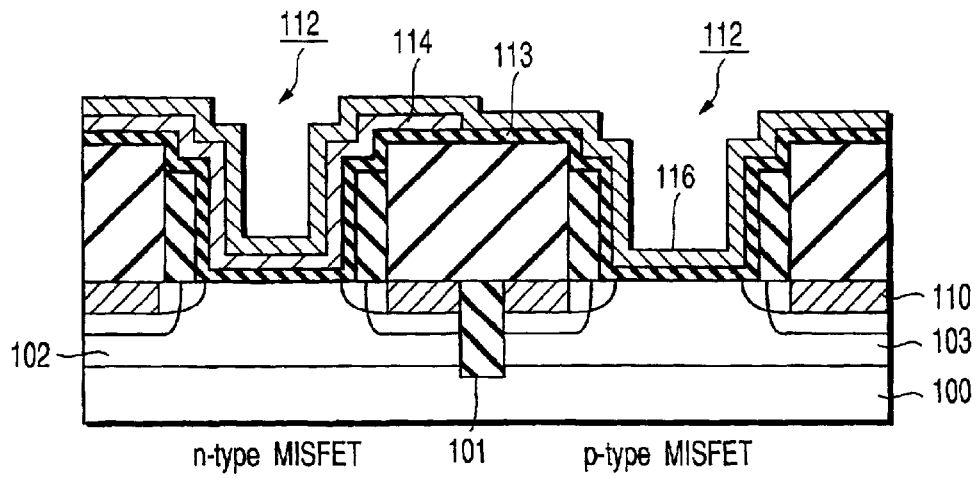
Figure 3J:
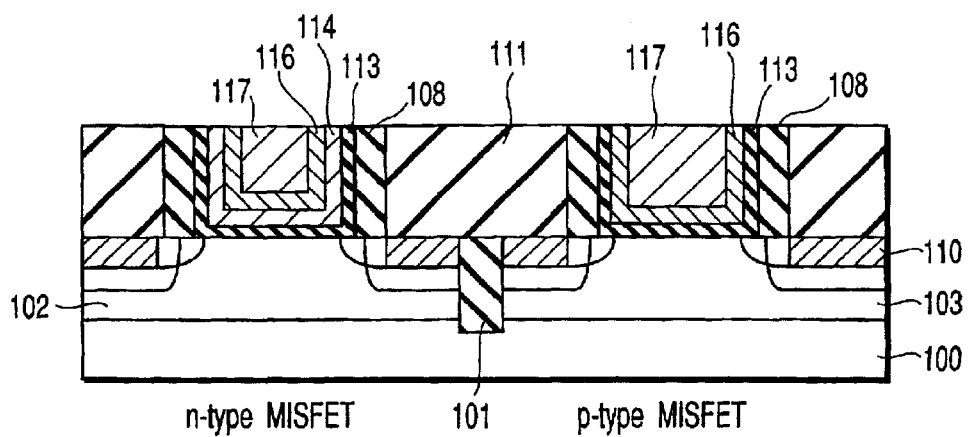
Figures 4A, 4B:
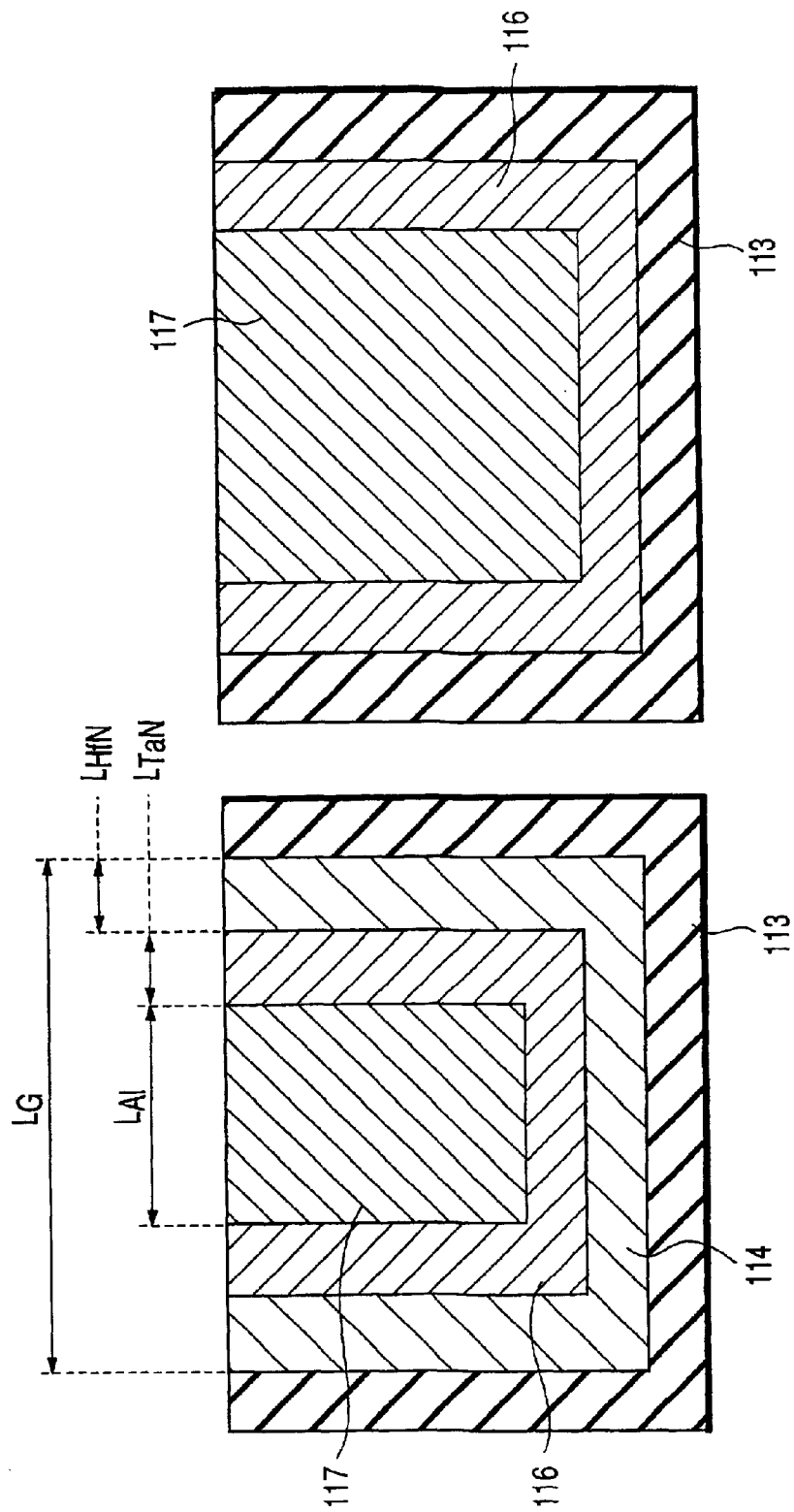
FIGS. 4A and 4B are cross-sectional views showing gate electrode portions of the n-type and p-type MISFETs fabricated by the steps shown in FIGS. 3A to 3J.

In FIG. 1I, aluminum (second metal-containing film) 117 is deposited as a gate electrode material, which has a lower resistance than the hafnium nitride film (first metal-containing film) 114 and graphite organic coating film 119, on the entire surface of the resultant by means of sputtering or CVD. Then, the aluminum is subjected to CMP, thus burying the aluminum 117 in the gate trenches.

A CMISFET is thus fabricated, which has gate electrode structures comprising, respectively, an n-type lamination structure of the hafnium nitride film 114, graphite organic coating film 119 and aluminum 117, and a p-type lamination structure of the graphite organic coating film 119 and aluminum 117.

Since the work function of the hafnium nitride film 114 is 4.6 eV or less and the work function of the conductive coating film is 4.6 ev or more, the gate electrode structures with optimized work functions for the n-type and p-type devices can be obtained.

In the present invention, unlike the prior art, diffusion of the aluminum 117 into the gate insulation film 113 can be surely prevented, and the aluminum 117 can be buried in the region with a gate length of 20 nm or less.

FIGS. 2A and 2B are enlarged views of the gate electrode portions of the n-type MISFET and p-type MISFET. Since the graphite organic coating film 119 is used, the graphite organic coating film 119 is not formed on the side face of the aluminum 117, but is formed only at the bottom of the aluminum 117, i.e. on the gate insulation film 113. Thus, a width $L_{A1}$ of the aluminum 117 of the n-type MISFET is expressed by $$L_{A1} = L_G - 2 \times L_{HfN}$$

where $L_{A1}$ is a width of the aluminum 117, $L_G$ is a gate length, and $L_{HfN}$ is a width of the hafnium nitride film 114.

In short, the width of the aluminum 117 does not depend on the thickness of the graphite organic coating film 119. The hafnium nitride film 114 functions only to set the work function of the gate electrode at 4.6 eV or less, and there is no problem even if the hafnium nitride film 114 is very thin and 1 nm thick. Assuming that the hafnium nitride film 114 is 1 nm thick, the aluminum 117 with a width of 8 nm can be buried in the region of with a gate length of 10 nm in the present invention.

Moreover, in the present invention, the thickness of the graphite organic coating film 119 can be increased by increasing the height h of the gate.

For example, if the gate height h is 100 nm, the aluminum 117 about 50 nm thick can be buried in the gate trench even if the graphite organic coating film 119 about 50 nm thick is formed in the gate trench. Unlike the prior art, the barrier properties for the aluminum electrode can be enhanced by increasing the thickness of the graphite organic coating film 119.

In the present embodiment, the aluminum 117 is used as the gate electrode. Alternatively, any material with a low resistance may be substituted. For example, there is no problem even if a film of ruthenium, platinum, cobalt, silver, copper or tungsten may be formed by sputtering, CVD or plating.

In addition, the hafnium nitride film is used as the electrode of the n-type MISFET. Alternatively, a zirconium nitride film or a titanium nitride film may be used as the electrode of the n-type MISFET since the work function can be set at 4.6 eV or less in this case, too.

The present invention is not limited to the above embodiment. Other semiconductor substrates may be substituted for the silicon substrate.

Other various modifications may be made without departing from the spirit of the present invention.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor device comprising:

a semiconductor substrate having a p-well and an n-well at a surface portion thereof;

an insulation film formed on the semiconductor substrate and having first and second openings at bottoms of which the p-well and n-well are exposed;

first and second gate insulation films formed on the n-well and p-well exposed at bottoms of the first and second openings;

a first gate electrode including a first metal-containing film, which is formed in contact with an inner side wall of the first opening and the first gate insulation film on the p-well and has a Fermi level higher than a center of a band gap of the semiconductor substrate, a first conductive film containing carbon and containing no metal element which is formed on a bottom portion of the first metal-containing film, and a second metal-containing film formed on the first conductive film and having a lower resistance than the first metal-containing film;

an n-type source and an n-type drain formed on the semiconductor substrate and configured to sandwich the first gate electrode;

a second gate electrode including a second conductive film containing carbon and containing no metal element, which is formed at a bottom portion of the second opening in contact with the gate insulation film on the n-well, the second conductive film being formed only at the bottom of the second opening, and a third metal-containing film formed on the second conductive film and having a lower resistance than the second conductive film; and a p-type source and a p-type drain formed on the semiconductor substrate and configured to sandwich the second gate electrode.

2. A semiconductor device according to claim 1, wherein said first metal-containing film is one of a hafnium nitride film, a zirconium nitride film and a titanium nitride film.

3. A semiconductor device according to claim 1, wherein said first and second conductive films contain graphitized carbon.

4. A semiconductor device according to claim 1, wherein said first and second conductive films are mainly formed on the same conductive material containing graphitized carbon and no metal element.

5. A semiconductor device according to claim 1, wherein said second and third metal-containing films are made of the same metal-containing material.

* * * * *

UNITED STATES PATENT AND TRADEMARK OFFICE
CERTIFICATE OF CORRECTION

PATENT NO. : 6,737,309 B2  Page 1 of 1
DATED : May 18, 2004
INVENTOR(S) : Kouji Matsuo It is certified that error appears in the above-identified patent and that said Letters Patent is hereby corrected as shown below:

<u>Title page, Item [54] and Column 1, line 1</u>,
Title, should be change from "COMPLEMENTARY MISFET" to
-- SEMICONDUCTOR DEVICE AND METHOD OF FABRICATING THE SAME --.

Signed and Sealed this

Twenty-fifth Day of January, 2005

JON W. DUDAS
*Director of the United States Patent and Trademark Office*